United States Patent
Hau-Riege et al.

(10) Patent No.: US 6,822,437 B1
(45) Date of Patent: Nov. 23, 2004

(54) INTERCONNECT TEST STRUCTURE WITH SLOTTED FEEDER LINES TO PREVENT STRESS-INDUCED VOIDS

(75) Inventors: Christine Hau-Riege, Fremont, CA (US); John Sanchez, Palo Alto, CA (US); Amit P. Marathe, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 18 days.

(21) Appl. No.: 10/361,239

(22) Filed: Feb. 10, 2003

(51) Int. Cl.[7] .............................................. H01L 23/48
(52) U.S. Cl. ..................... 324/158.1; 257/758; 438/622
(58) Field of Search ............................. 324/158.1, 526, 324/537, 764; 257/758, 773–775, 798; 438/622–624, 642, 644, 648; 338/308

(56) References Cited

U.S. PATENT DOCUMENTS 3,629,782 A  *  12/1971  Sahni .......................... 338/308
5,689,139 A  *  11/1997  Bui et al. ..................... 257/758
5,712,510 A  *  1/1998  Bui et al. ..................... 257/758
6,171,947 B1 *  1/2001  Pangrle et al. .............. 438/624

OTHER PUBLICATIONS

E.T. Ogawa et al., *Stress–Induced Voiding under Vias Connected to Wide Cu Metal Leads*, Proc. of IRPS, 2002, pp. 312–321 (no month).

* cited by examiner

*Primary Examiner*—Minh N. Tang
(74) *Attorney, Agent, or Firm*—Monica H. Choi

(57) ABSTRACT

An interconnect test structure for characterizing electromigration includes a test line and a feeder coupled to the test line by a via structure. A width of the feeder line is greater than a width of the test line. Slots are formed in the feeder line for preventing formation of a stress-induced void at an interface between the feeder line and the via structure. Thus, an increase in resistance of the test structure is attributable to electromigration failure of the test line.

32 Claims, 8 Drawing Sheets

US 6,822,437 B1

INTERCONNECT TEST STRUCTURE WITH SLOTTED FEEDER LINES TO PREVENT STRESS-INDUCED VOIDS

TECHNICAL FIELD

The present invention relates generally to interconnect technology in integrated circuit fabrication, and more particularly, to a structure and method for testing for electromigration failure rate of interconnect using slotted feeder lines to prevent formation of stress-induced voids within the feeder lines.

BACKGROUND OF THE INVENTION

FIG. 1 shows an interconnect test structure 100 including a test line 102, a first feeder line 104, and a second feeder line 106, according to the prior art. The test line 102, the first feeder line 104, and the second feeder line 106 are comprised of copper for example. In that case, the test line 102, the first feeder line 104, and the second feeder line 106 are each surrounded by a respective diffusion barrier layer material 112, 114, and 116.

The first feeder line 104 is coupled to a first test pad 108, and the second feeder line 106 is coupled to a second test pad 110. The test line 102 is coupled to the first feeder line 104 by a first via structure 122 at a first end of the test line 102, and the test line 102 is coupled to the second feeder line 106 by a second via structure 124 at a second end of the test line 102. The first and second via structures 122 and 124 may each be comprised of copper according to the prior art.

FIG. 2 shows a top view of the interconnect test structure 100 of FIG. 1 that is used for characterizing electromigration failure rate of the test line 102. The first and second feeder lines 104 and 106 each have a width, $w_f$, 162 that is substantially greater than a width, $w_t$, 164 of the test line 102. For example, the width, $w_f$, 162, of the first and second feeder lines 104 and 106 is at least about ten times greater than the width, $w_t$, 164 of the test line 102. A current source 206 and a resistance meter 208 are coupled between the first and second test pads 108 and 110. A processor 212 and a timer 210 monitor the resistance across the first and second test pads 108 and 110 as current is conducted through the first feeder line 104, the test line 102, and the second feeder line 106.

The first feeder line 104 is a source of electrons (i.e., a cathode) flowing into the test line 102, and the second feeder line 106 is a sink of electrons (i.e., an anode) flowing out of the test line 102. For characterizing the electromigration failure rate of the test line 102, a current is conducted through the test line 102 with a current density, J. A length, L, 103 of the test line 102 and the current density, J, through the test line 102 are designed such that the product of such values (J*L) is greater than a critical Blech length constant $(J*L)_{CRIT}$ corresponding to the test line 102. The critical Blech length constant $(J*L)_{CRIT}$ is a constant for an interconnect line depending on various processing parameters for the interconnect line such as the material comprising the interconnect line and the material surrounding the interconnect line for example, as known to one of ordinary skill in the art of integrated circuit fabrication.

When the current density, J, and the length, L, for an interconnect line are designed such that the product of such values (J*L) is less than the critical Blech length constant $(J*L)_{CRIT}$, then that interconnect line is immortal and does not exhibit electromigration failure, as known to one of ordinary skill in the art of integrated circuit fabrication. On the other hand, when the current density, J, and the length, L, for an interconnect line are designed such that the product of such values (J*L) is greater than the critical Blech length constant $(J*L)_{CRIT}$, the interconnect line does exhibit electromigration failure.

For characterizing the electromigration failure rate of the test line 102, with the current density, J, and the length, L, for the test line 102 being designed such that the product of such values (J*L) is greater than the critical Blech length constant $(J*L)_{CRIT}$ for the test line 102, an electromigration life-time is determined when the resistance measured by the resistance meter 208 reaches a threshold resistance level, as known to one of ordinary skill in the art of integrated circuit fabrication. Referring to FIG. 1, the test line 102 exhibits such electromigration failure from formation of an electromigration void 123 within the test line 102 that typically causes the resistance of the test line 102 to rise sharply.

To ensure that the electromigration void 123 is formed within the test line 102 and not within the feeder lines 104 and 106 when characterizing the test line 102, the width, $w_f$, 162, of each of the first and second feeder lines 104 and 106 is designed to be substantially greater (such as at least about ten times greater) than the width, $w_t$, 164 of the test line 102. However, as described in the journal article, *Stress-Induced Voiding under Vias Connected to Wide Cu Metal Leads*, Proc. of IEEE International Reliability Physics Symposium, pp. 312–321 (2002), to E. T. Ogawa et al., with such large widths, $w_f$, 162, of the feeder lines 104 and 106, although such feeder lines 104 and 106 do not exhibit electromigration failure, stress-induced voids 125 tend to form at the interface between such feeder lines 104 and 106 and a respective one of the first and second via structures 122 and 124.

With formation of such stress-induced voids 125 within the feeder lines 104 and 106, the increase in resistance as measured by the resistance meter 208 can no longer be attributable solely to electromigration failure within the test line 102. Thus, because of formation of such stress-induced voids 125 within the feeder lines 104 and 106, electromigration failure rate of the test line 102 cannot be characterized with the interconnect test structure 100 of the prior art.

Nevertheless, accurate characterization of electromigration failure rate of the test line 102 is desired. Thus, a interconnect test structure is needed for accurately characterizing electromigration failure rate of the test line 102 of the interconnect test structure without formation of stress-induced voids within the feeder lines 104 and 106.

SUMMARY OF THE INVENTION

Accordingly, in a general aspect of the present invention, feeder lines of an interconnect test structure are formed to be slotted to prevent formation of stress-induced voids therein during characterization of electromigration failure rate of the test line of the interconnect test structure.

In one embodiment of the present invention, an interconnect test structure used for characterizing electromigration failure rate of interconnect includes a test line comprised of a conductive material and having a current density, J. and a length, L. A product of the current density and the length of the test line, J*L, is greater than a critical Blech length constant, $(J*L)_{CRIT}$, for the test line. The interconnect test structure further includes a first feeder line comprised of a conductive material and coupled to the test line at a first end of the test line. The first feeder line is a source of electrons flowing into the test line. The interconnect test structure also includes a second feeder line comprised of a conductive material and coupled to the test line at a second end of the test line. The second feeder line is a sink of electrons flowing from the test line. A width of each of the first and second feeder lines is greater than a width of the test line.

In addition, the interconnect test structure includes a first via structure disposed between the first feeder line and the test line, and includes a second via structure disposed between the second feeder line and the test line. At least one of the first and second feeder lines has at least one slot formed therein for preventing formation of a stress-induced void at an interface between the feeder line having the slot formed therein and a respective one of the first and second via structures.

In this manner, formation of at least one slot within a feeder line reduces the volume of the feeder line. With such reduced volume of the feeder line, formation of a stress-induced void at the interface of the feeder line and a via structure on the feeder line is prevented. In addition, the width of the feeder line is still maintained to be substantially larger than the width of the test line to prevent electromigration failure of the feeder line. Thus, an increase in resistance across the feeder lines and the test line may be attributed to electromigration failure of the test line from formation of an electromigration void within the test line such that the electromigration failure rate of the test line may be accurately characterized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

Figure 1:
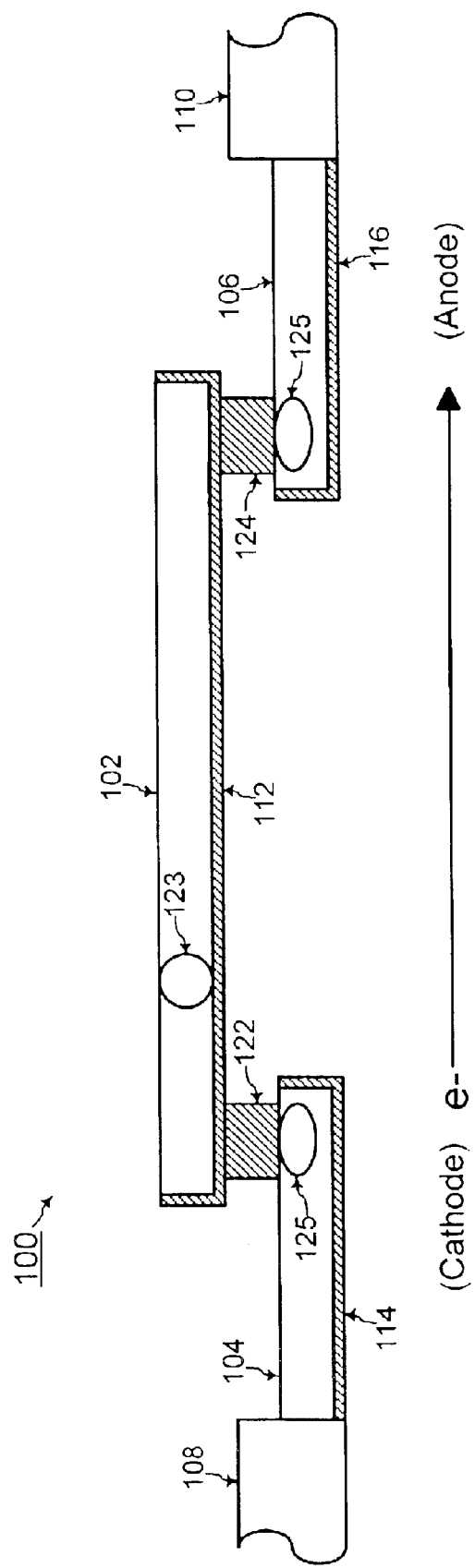
FIG. 1 shows a cross-sectional view of an interconnect test structure with formation of stress-induced voids within wide feeder lines, according to the prior art.
Figure 2:
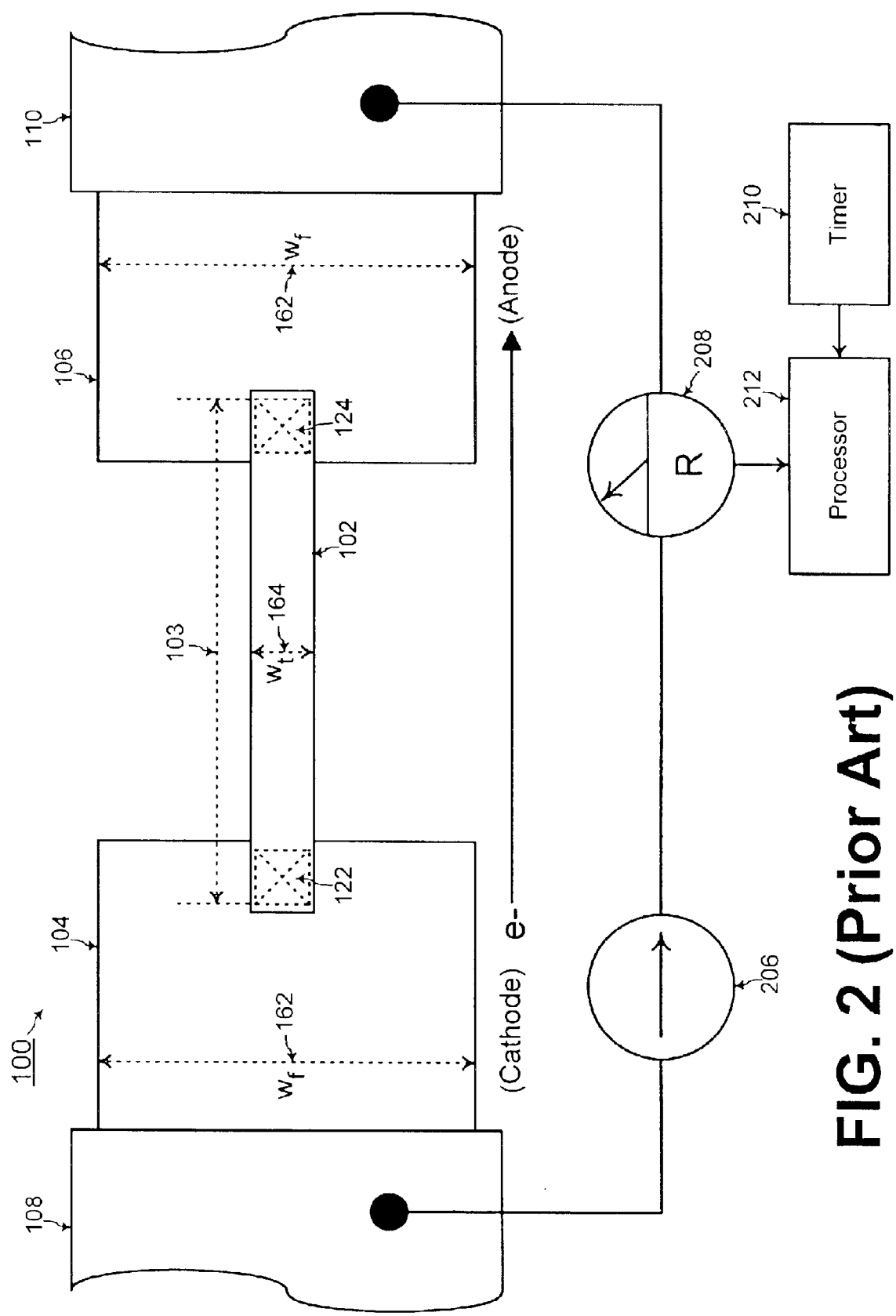
FIG. 2 shows a top view of the interconnect test structure of FIG. 1 during characterization of the electromigration failure rate of the interconnect test structure of the prior art.
Figure 3:
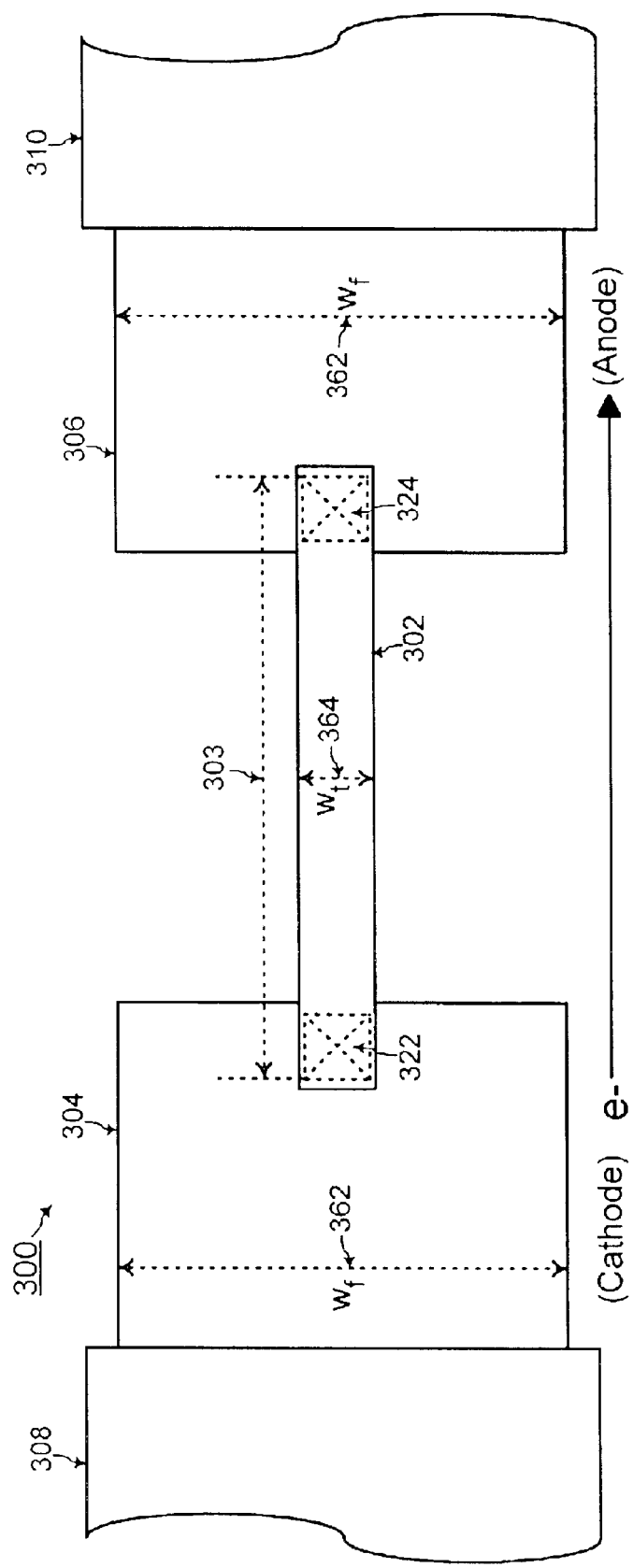
FIG. 3 shows a top view of the interconnect test structure before formation of a plurality of slots within the feeder lines of the interconnect test structure, according to an embodiment of the present invention.

FIG. 3 shows an interconnect test structure 300 including a test line 302, a first feeder line 304, and a second feeder line 306, according to an embodiment of the present invention. The test line 302, the first feeder line 304, and the second feeder line 306 are comprised of copper in one embodiment of the present invention. The first feeder line 304 is coupled to a first test pad 308, and the second feeder line 306 is coupled to a second test pad 310. The test line 302 is coupled to the first feeder line 304 by a first via structure 322 at a first end of the test line 302, and the test line 302 is coupled to the second feeder line 306 by a second via structure 324 at a second end of the test line 302.

In one embodiment of the present invention, the first and second via structures 322 and 324 are no-flux via structures that are comprised of an impermeable conductive material such as tungsten for example. In that case, the conductive material comprising the test line 302 does not move outside of the test line 302 during characterization of the electromigration failure rate of the test line 302.

The first and second feeder lines 304 and 306 each have a width, $w_f$, 362 that is substantially greater than a width, $w_t$, 364 of the test line 302. For example, the width, $w_f$, 362, of the first and second feeder lines 304 and 306 is at least about ten times greater than the width, $w_t$, 364 of the test line 302. In addition, the test line 302 is designed to have a length, L, 303 such that with a current density, J, flowing through the test line 302, the product of such values (J*L) is greater than a critical Blech length constant $(J*L)_{CRIT}$ corresponding to the test line 302. The critical Blech length constant $(J*L)_{CRIT}$ is a constant for an interconnect line depending on various processing parameters for the interconnect line such as the material comprising the interconnect line and the material surrounding the interconnect line for example, as known to one of ordinary skill in the art of integrated circuit fabrication.

When the current density, J, and the length, L, for an interconnect line are designed such that the product of such values (J*L) is less than the critical Blech length constant $(J*L)_{CRIT}$, then that interconnect line is immortal and does not exhibit electromigration failure, as known to one of ordinary skill in the art of integrated circuit fabrication. On the other hand, when the current density, J, and the length, L, for an interconnect line are designed such that the product of such values (J*L) is greater than the critical Blech length constant $(J*L)_{CRIT}$, the interconnect line does exhibit electromigration failure.

Figure 4:
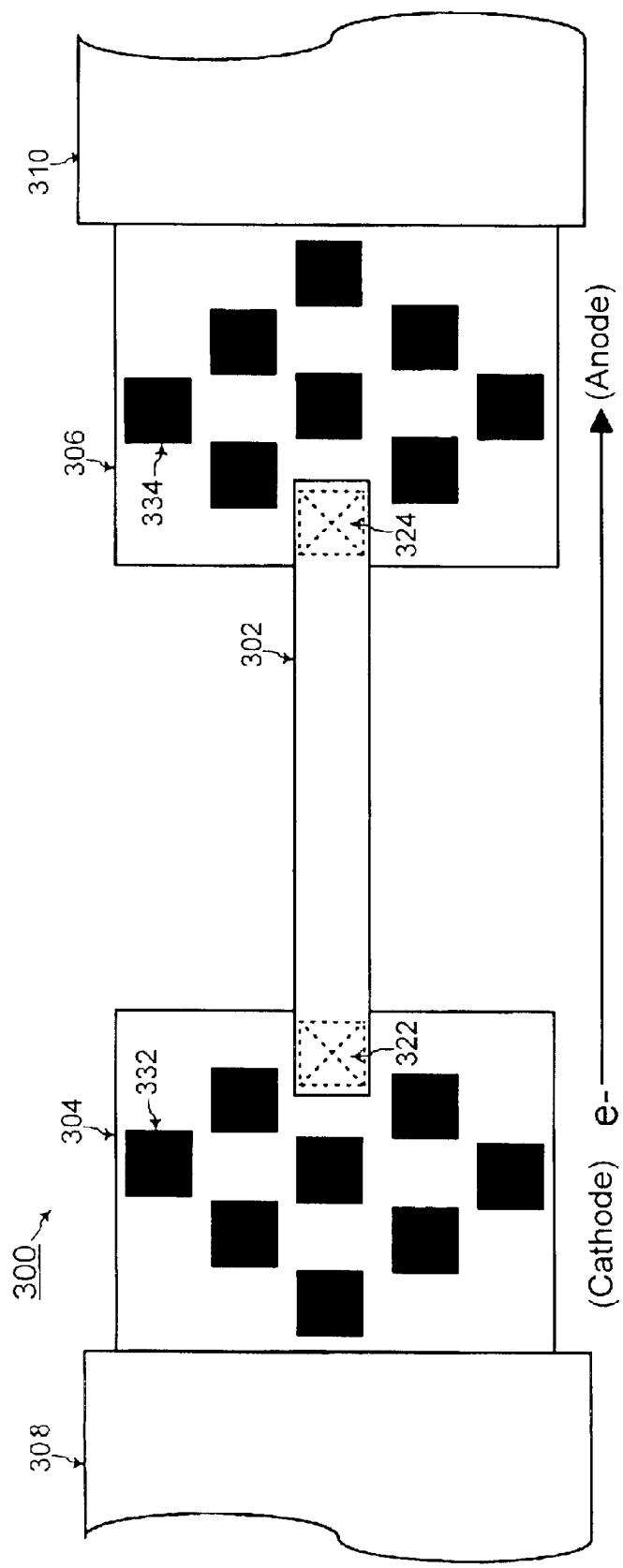
FIG. 4 shows a top view of the interconnect test structure after formation of a plurality of square-shaped slots within the feeder lines of the interconnect test structure of FIG. 3, according to an embodiment of the present invention.

Referring to FIGS. 3 and 4, a first plurality of slots 332 are formed within the first feeder line 304, and a second plurality of slots 334 are formed within the second feeder line 306. The first and second plurality of slots 332 and 334 are openings formed within the first and second feeder lines 304 and 306 for removing volume of material comprising the first and second feeder lines 304 and 306. In FIG. 4, the first and second plurality of slots 332 and 334 are square-shaped. Alternatively, referring to FIG. 5, the first and second plurality of slots 332 and 334 are formed to be circular-shaped.

The present invention may be practiced with any type of shape for the openings forming the slots 332 and 334 through the feeder lines 304 and 306, as would be apparent to one of ordinary skill in the art from the description herein. With any type of shape of the openings forming the slots 332 and 334 through the feeder lines 304 and 306, volume of the material comprising the feeder lines 304 and 306 is removed from the feeder lines 304 and 306.

Figure 5:
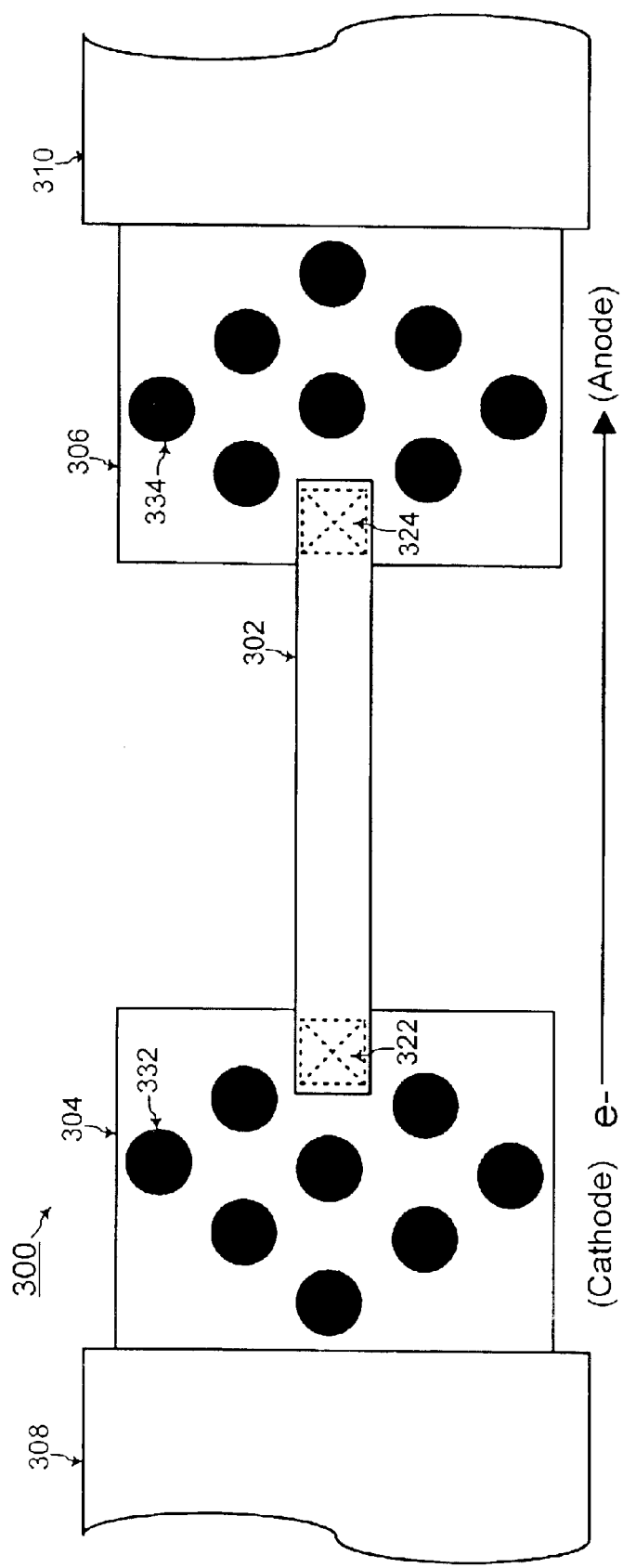
FIG. 5 shows a top view of the interconnect test structure after formation of a plurality of circular-shaped slots within the feeder lines of the interconnect test structure of FIG. 3, according to an embodiment of the present invention.
Figure 6:
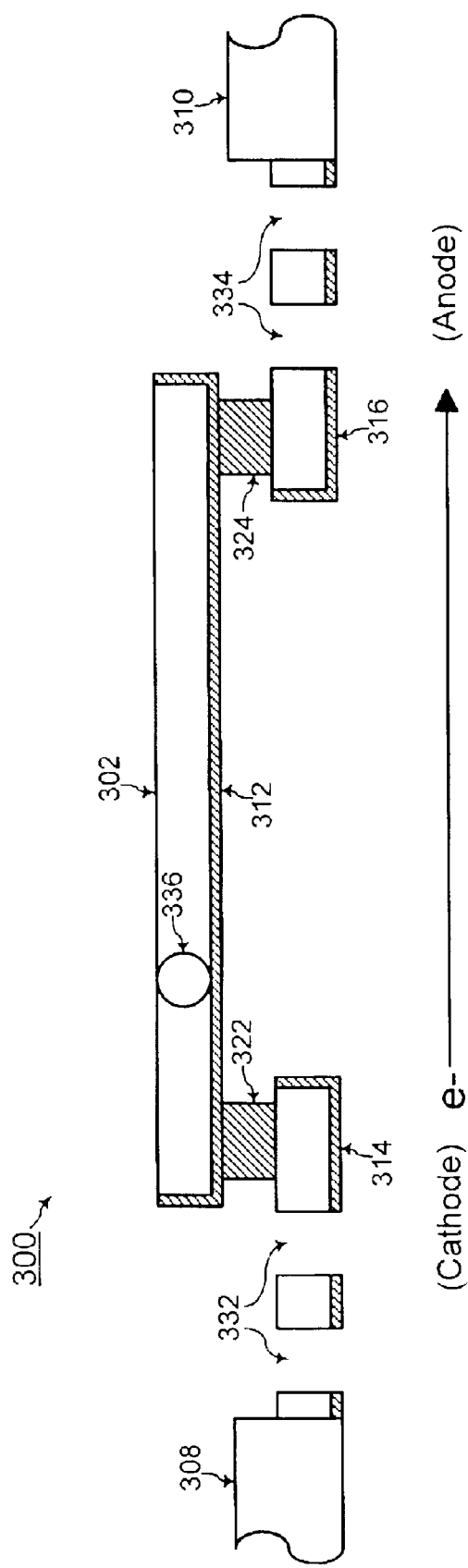
FIG. 6 shows a cross-sectional view of the interconnect test structure of FIG. 4 or FIG. 5 with formation of slots completely through the feeder lines of the interconnect test structure, according to an embodiment of the present invention.

FIG. 6 shows a cross-sectional view of the interconnect test structure 300 of FIG. 4 or FIG. 5 along the length of the test line 302. In the case that the test line 302, the first feeder line 304, and the second feeder line 306 are each comprised of copper, the test line 302, the first feeder line 304, and the second feeder line 306 are each surrounded by a respective diffusion barrier layer material 312, 314, and 316. Referring to FIG. 6, note that the first plurality of slots 332 are openings formed completely through the thickness of the first feeder line 304, and the second plurality of slots 334 are openings formed completely through the thickness of the second feeder line 306.

Figure 7:
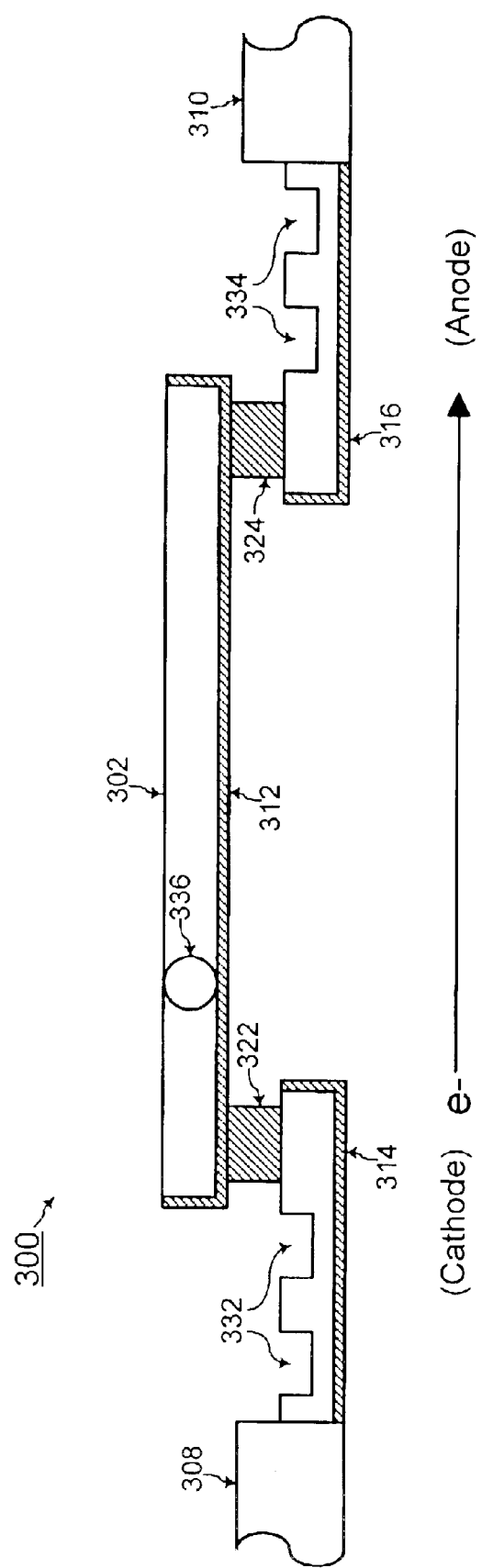
FIG. 7 shows a cross-sectional view of the interconnect test structure of FIG. 4 or FIG. 5 with formation of slots partially through the feeder lines of the interconnect test structure, according to an embodiment of the present invention.

Alternatively, referring to FIG. 7, the present invention may also be practiced when the first plurality of slots 332 are openings formed partially through the thickness of the first feeder line 304, and the second plurality of slots 334 are openings formed partially through the thickness of the second feeder line 306. In either the case of FIG. 6 or FIG. 7, note that the via structures 322 and 324 are preferably not disposed over any portion of the openings forming the slots 332 and 334 to prevent an increase in resistance through the interconnect test structure 300.

Figure 8:
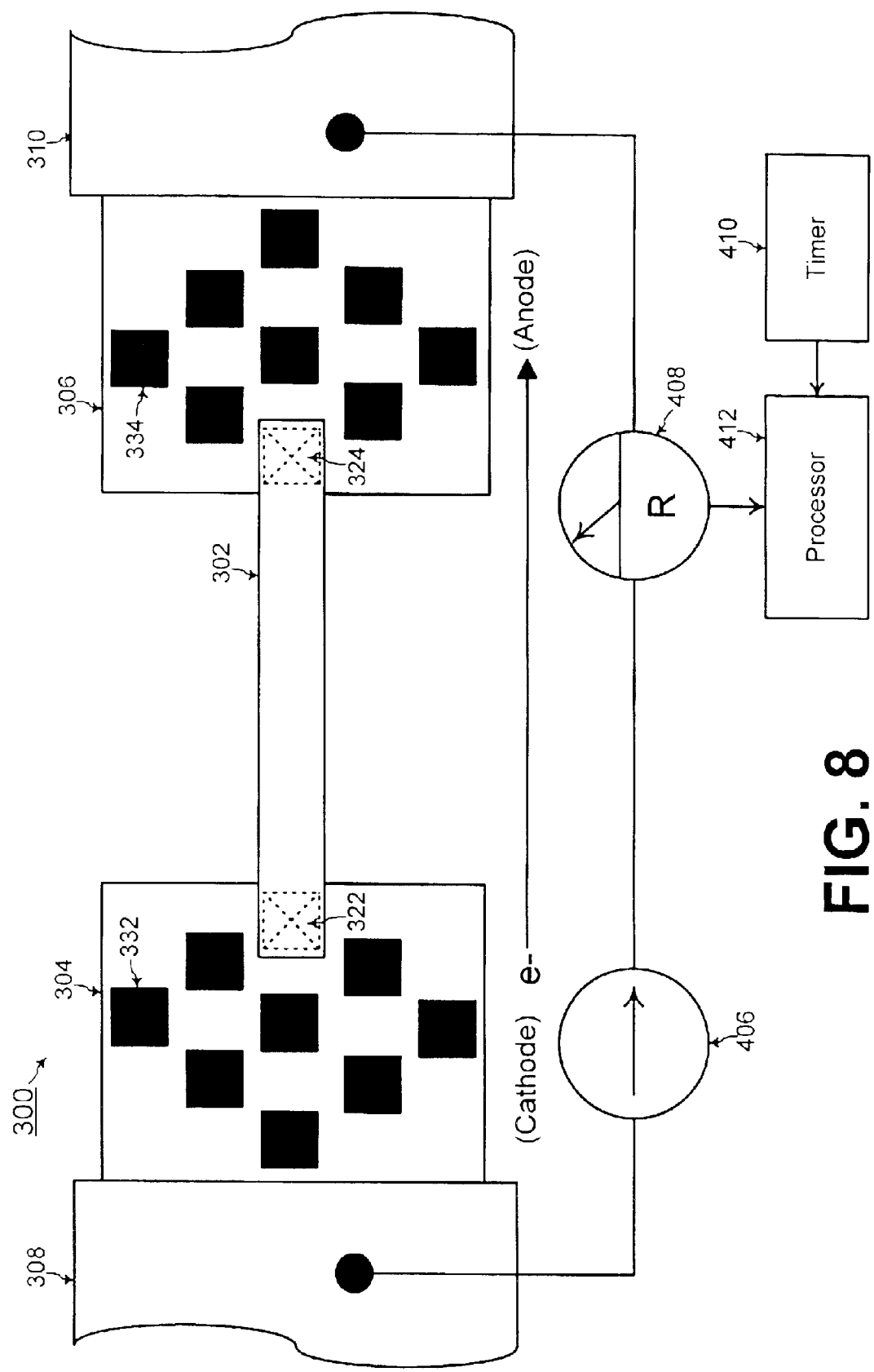
FIG. 8 shows the top view of the interconnect test structure of FIG. 4 with additional components for characterizing the electromigration failure rate of the test line of the interconnect test structure, according to an embodiment of the present invention.

In either case of FIG. 6 or 7, referring to FIG. 8, a current source 406 and a resistance meter 408 are coupled between the first and second test pads 308 and 310. A processor 412 and a timer 410 monitor the resistance across the first and second test pads 308 and 310 as current is conducted through the first feeder line 304, the test line 302, and the second feeder line 306. The first feeder line 304 is a source of electrons (i.e., a cathode) flowing into the test line 302, and the second feeder line 306 is a sink of electrons (i.e., an anode) flowing out of the test line 302. For characterizing the electromigration failure rate of the test line 302, a current is conducted through the test line 302 with the current density, J. The length, L, 303 of the test line 302 and the current density J through the test line 302 are designed such that the product of such values (J*L) is greater than a critical Blech length constant (J*L)$_{CRIT}$ corresponding to the test line 302.

For characterizing the electromigration failure rate of the test line 302, with the current density, J, and the length, L, for the test line 302 being designed such that the product of such values (J*L) is greater than the critical Blech length constant (J*L)$_{CRIT}$ for the test line 302, an electromigration life-time is determined when the resistance measured by the resistance meter 408 reaches a threshold resistance level. Referring to FIGS. 4, 5, 6, and 7, when the plurality of slots 332 and 334 are formed in the first and second feeder lines 304 and 306, formation of a stress-induced void within each of the feeder lines 304 and 306 under the respective one of the via structures 322 and 324 is prevented. Thus, when the resistance measured by the resistance meter 408 rises beyond the threshold resistance level, such increase of measured resistance may be attributed to electromigration failure of the test line 302 from formation of an electromigration void 336 within the test line 302.

In this manner, formation of the slots 332 and 334 within each of the feeder lines 304 and 306 reduces the volume of each of the feeder lines 304 and 306. With such reduced volume of a feeder line, formation of a stress-induced void at the interface of the feeder line and a via structure on the feeder line is prevented. In addition, the width of the feeder line is still maintained to be substantially larger than the width of the test line 302 to prevent electromigration failure of the feeder line. Thus, an increase in resistance across the feeder lines 304 and 306 and the test line 302 in the interconnect test structure 300 may be attributed to electromigration failure of the test line 302 from formation of the electromigration void 336 within the test line 302 such that the electromigration failure rate of the test line 302 may be accurately characterized.

The foregoing is by way of example only and is not intended to be limiting. Any specified material or any specified dimension of any structure described herein is by way of example only. For example, the present invention may be practiced when the test line 302 and the feeder lines 304 and 306 of the interconnect test structure 300 are comprised of various types of conductive material and are comprised of same or different conductive materials from each-other, as would be apparent to one of ordinary skill in the art from the description herein. Additionally, the present invention may be practiced when the slots 332 and 334 are formed in the feeder lines 304 and 306 with different shapes and different locations within the feeder lines 304 and 306, as long as the slots 332 and 334 remove volume of material comprising the feeder lines 304 and 306. Furthermore, the present invention may be practiced when at least one slot removing volume of material from a feeder line is formed within one or both of the feeder lines 304 and 306.

In addition, as will be understood by those skilled in the art, the structures described herein may be made or used in the same way regardless of their position and orientation. For example, the feeder lines 304 and 306 are illustrated in FIGS. 3, 4, 5, 6, 7, and 8 to be formed on a lower interconnect level below the test line 302. However, the present invention may also be practiced when the feeder lines 304 and 306 are formed on a higher interconnect level above the test line 302 with a via structure formed between such a feeder line and the test line 302. Thus, it is to be understood that terms and phrases such as "on" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. An interconnect test structure for characterizing electromigration failure of interconnect, comprising:

a test line comprised of a conductive material, and a first feeder line comprised of a conductive material and coupled to the test line by a first via structure;

wherein a width of the first feeder line is greater than a width of the test line; and at least one slot formed in the first feeder line for preventing formation of a stress-induced void at an interface between the first feeder line and the first via structure, wherein no slot is formed in the narrower test line such that an increase of resistance across the interconnect test structure is attributable to electromigration failure of the test line.

2. The interconnect test structure of claim 1, wherein a current is conducted through the test line with a current density, J, with the test line having a length, L, and wherein a current density and length product of the test line, J*L, is greater than a critical Blech length constant, (J*L)$_{CRIT}$, for the test line.

3. The interconnect test structure of claim 1, wherein the width of the first feeder line is at least ten times greater than the width of the test line.

4. The interconnect test structure of claim 1, wherein the at least one slot is a plurality of holes formed completely through the first feeder line.

5. The interconnect test structure of claim 1, wherein the at least one slot is a plurality of holes formed partially through the first feeder line for preventing formation of a void within the first feeder line.

6. The interconnect test structure of claim 1, wherein the first via structure is not disposed over any portion of an opening comprising the at least one slot.

7. The interconnect test structure of claim 1, wherein the first via structure is a no-flux via structure.

8. The interconnect test structure of claim 7, wherein the no-flux via structure is comprised of an impermeable conductive material.

9. The interconnect test structure of claim 8, wherein the no-flux via structure is comprised of tungsten.

10. The interconnect test structure of claim 1, wherein the test line and the first feeder line are each comprised of copper.

11. The interconnect test structure of claim 1, wherein the first feeder line is a source of electrons flowing into the test line, and wherein the interconnect test structure further comprises:

a second feeder line, having a width greater than the width of the test line, and comprised of a conductive material, and coupled to the test line by a second via structure, and being a sink of electrons flowing from the test line;

wherein the second feeder line has at least one slot formed therein for preventing formation of a stress-induced void at an interface between the second feeder line and the second via structure.

12. The interconnect test structure of claim 11, wherein the width of each of the first and second feeder lines is at least ten times greater than the width of the test line.

13. The interconnect test structure of claim 11, wherein a plurality of holes are formed as slots completely through each of the first and second feeder lines.

14. The interconnect test structure of claim 11, wherein a plurality of holes are formed as slots partially through each of the first and second feeder lines, for preventing formation of a void within each of the first and second feeder lines.

15. The interconnect test structure of claim 11, wherein the first and second via structures are not disposed over any portion of an opening comprising a slot.

16. The interconnect test structure of claim 11, wherein each of the first and second via structures is a no-flux via structure.

17. The interconnect test structure of claim 11, wherein the test line and the first and second feeder lines are each comprised of copper.

18. A method for characterizing electromigration failure of interconnect, including the steps of:

forming a test line, a first feeder line, and a first via structure between the first feeder line and the test line, wherein a width of the first feeder line is greater than a width of the test line; and forming at least one slot within the first feeder line for preventing formation of a stress-induced void at an interface between the first feeder line and the first via structure, wherein no slot is formed in the narrower test line such that an increase of resistance across the test line and the first feeder line is attributable to electromigration failure of the test line.

19. The method of claim 18, wherein a current is conducted through the test line with a current density, J, with the test line having a length, L, and wherein a current density and length product of the test line, $J*L$, is greater than a critical Blech length constant, $(J*L)_{CRIT}$, for the test line.

20. The method of claim 18, wherein the width of the first feeder line is at least ten times greater than the width of the test line.

21. The method of claim 18, wherein the at least one slot is a plurality of holes formed completely through the first feeder line.

22. The method of claim 18, wherein the at least one slot is a plurality of holes formed partially through the first feeder line for preventing formation of a void within the first feeder line.

23. The method of claim 18, wherein the first via structure is not disposed over any portion of an opening comprising a slot.

24. The method of claim 18, wherein the first via structure is a no-flux via structure.

25. The method of claim 18, wherein the test line and the first feeder line are each comprised of copper.

26. The method of claim 18, wherein the first feeder line is a source of electrons flowing into the test line, the method further including the steps of:

forming a second feeder line, having a width greater than the width of the test line, and comprised of a conductive material, and coupled to the test line by a second via structure, and being a sink of electrons flowing from the test line; and forming at least one slot in the second feeder line for preventing formation of a stress-induced void at an interface between the second feeder line and the second via structure.

27. The method of claim 26, wherein the width of each of the first and second feeder lines is at least ten times greater than the width of the test line.

28. The method of claim 26, wherein a plurality of holes are formed as slots completely through each of the first and second feeder lines.

29. The method of claim 26, wherein a plurality of holes are formed as slots partially through each of the first and second feeder lines, for preventing formation of a void within each of the first and second feeder lines.

30. The method of claim 26, wherein the first and second via structures are not disposed over any portion of an opening comprising a slot.

31. The method of claim 26, wherein each of the first and second via structures is a no-flux via structure.

32. The method of claim 26, wherein the test line and the first and second feeder lines are each comprised of copper.

* * * * *